United States Patent
Zhang

(10) Patent No.: US 9,639,065 B2
(45) Date of Patent: May 2, 2017

(54) METHOD AND ELECTRONIC DEVICE FOR DISPLAYING OPERATING STATE INFORMATION

(71) Applicants: BEIJING LENOVO SOFTWARE LTD., Beijing (CN); LENOVO (BEIJING) LIMITED, Beijing (CN)

(72) Inventor: Yigan Zhang, Beijing (CN)

( * ) Notice: Subject to any disclaimer, the term of this patent is extended or adjusted under 35 U.S.C. 154(b) by 248 days.

(21) Appl. No.: 14/495,710

(22) Filed: Sep. 24, 2014

(65) Prior Publication Data

US 2015/0254875 A1    Sep. 10, 2015

(30) Foreign Application Priority Data

Mar. 10, 2014  (CN) .......................... 2014 1 0085990

(51) Int. Cl.
| | |
|---|---|
| *G04G 9/00* | (2006.01) |
| *G04B 19/04* | (2006.01) |
| *G01R 22/10* | (2006.01) |
| *G06T 11/20* | (2006.01) |
| *H04M 1/725* | (2006.01) |

(52) U.S. Cl.
CPC .......... *G04G 9/0064* (2013.01); *G01R 22/10* (2013.01); *G04B 19/048* (2013.01); *G06T 11/203* (2013.01); *H04M 1/72544* (2013.01)

(58) Field of Classification Search
None
See application file for complete search history.

(56) References Cited

U.S. PATENT DOCUMENTS

| | | | | |
|---|---|---|---|---|
| 2004/0041570 A1* | 3/2004 | Haeni | .................... | G04C 10/04 324/435 |
| 2013/0286793 A1* | 10/2013 | Umamoto | ............ | G04G 9/0064 368/67 |
| 2016/0154537 A1* | 6/2016 | Lee | ....................... | G06F 3/0481 715/781 |

* cited by examiner

*Primary Examiner* — Vu Nguyen

(74) *Attorney, Agent, or Firm* — Sills Cummis & Gross P.C.

(57) ABSTRACT

An information processing method and an electronic device are provided. The method includes displaying a first identifier indicating time information on a display unit of an electronic device; acquiring first operating state information indicating a first operating state of a first functional unit of the electronic device; determining a first display state of the first identifier based on the first operating state information; and controlling the first identifier to be displayed at the first display state to indicate that the first functional unit is in the first operating state. With the method and electronic device of the disclosure, the display area of the display unit can be efficiently used without occupying a specified display area on the display unit to indicate operating state information of the electronic device.

6 Claims, 5 Drawing Sheets

METHOD AND ELECTRONIC DEVICE FOR DISPLAYING OPERATING STATE INFORMATION

CROSS REFERENCE TO RELATED APPLICATIONS

This application claims priority from Chinese National Application No. 201410085990.3 filed on Mar. 10, 2014, the contents of which are incorporated herein by reference.

TECHNICAL FIELD

The disclosure relates to electronic technologies, and more particularly, to information processing methods and electronic devices.

BACKGROUND

With rapid development of electronic technologies, people's lives have been associated with networks and electronic products having various functions. As people's living standard improves, portable electronic products such as smart watch, smart glasses, smart phone and the like become more popular.

Currently, some operating state information of an electronic device is displayed on a display unit of the electronic device for easy use. For example, radio frequency signal strength of a radio frequency unit of the electronic device is displayed on the display unit, so that the user can move to a position where signal strength for communication is stronger according to the displayed radio frequency signal strength. Or, remaining capacity information of a battery is displayed on the display unit, so that the user can timely charge the battery when the remaining capacity is low.

The inventor of present disclosure found that: at present, operating state information such as radio frequency signal strength or remaining capacity, is indicated by a specified operating state identifier displayed on the display unit, which occupies part of the display area of the display unit, leading to inefficient use of the display area.

SUMMARY

Embodiments of the present disclosure provide information processing methods and electronic devices, at least in view of the above problems with the conventional solutions.

In an aspect, the embodiments of the present disclosure provide an information processing method comprising: displaying a first identifier indicating time information on a display unit of an electronic device; acquiring first operating state information indicating a first operating state of a first functional unit of the electronic device; determining a first display state of the first identifier based on the first operating state information; and controlling the first identifier to be displayed at the first display state to indicate that the first functional unit is in the first operating state.

In an embodiment, in a case that the first identifier is a time scale identifier, said determining the first display state of the first identifier further comprises: determining a second display state of scale lines in a first scale section of the time scale identifier, and a third display state of remaining scale section of the time scale identifier other than the first scale section. The first scale section is a part of the time scale identifier. The second display state indicates that the first functional unit is in the first operating state, and the time scale identifier indicates the time information.

In an embodiment, in a case that the first identifier is a character identifier, said determining the first display state of the first identifier further comprises: determining a fourth display state of a delimiter identifier in the character identifier and a fifth display state of a digit identifier in the character identifier. The digit identifier is delimited by the delimiter identifier. The fourth display state indicates that the first functional unit is in the first operating state, and the character identifier indicates the time information.

In an embodiment, said determining a first display state of the first identifier based on the first operating state information comprises: searching for the first display state corresponding to the first operating state information, according to a preset relation between operating state information and display states; and determining that current display state of the first identifier is the first display state.

In an embodiment, after determining that current display state of the first identifier is the first display state, the method further comprises: acquiring second operating state information of the second operating state, in a case that the operating state of the first functional unit is changed from the first operating state to a second operating state; searching for a sixth display state corresponding to the second operating state information according to the preset relation between operation state information and display states; and changing display state of the first identifier to the sixth display state.

In another aspect, the embodiments of the present disclosure provide an electronic device, comprising: a first functional unit; a display unit configured to display a first identifier indicating time information; and a processing unit configured to acquire first operating state information indicating a first operating state of the first functional unit, determine a first display state of the first identifier based on the first operating state information, and control the first identifier to be displayed at the first display state to indicate that the first functional unit is in the first operating state.

In an embodiment, in a case that the first identifier is a time scale identifier, the processing unit is further configured to determine a second display state of scale lines in the first scale section of the time scale identifier and a third display state of remaining scale section of the time scale identifier other than the first scale section. The first scale section is a part of the time scale identifier. The second display state indicates that the first functional unit is in the first operating state, and the time scale identifier indicates the time information.

In an embodiment, in a case that the first identifier is a character identifier, the processing unit is further configured to determine a fourth display state of a delimiter identifier in the character identifier and a fifth display state of a digit identifier in the character identifier. The digit identifier is delimited by the delimiter identifier. The fourth display state indicates that the first functional unit is in the first operating state, and the character identifier indicates the time information.

In an embodiment, the processing unit is further configured to determine the first display state of the first identifier based on the first operating state information by: searching for the first display state corresponding to the first operating state information, according to a preset relation between operating state information and display states; and determining that current display state of the first identifier is the first display state.

In an embodiment, the processing unit is further configured to: acquire second operating state information of the second operating state in a case that the operating state of the first functional unit is changed from the first operating state to a second operating state; search for a sixth display state corresponding to the second operating state information according to the preset relation between operation state information and display states; and change display state of the first identifier to the sixth display state.

DETAILED DESCRIPTION OF THE EMBODIMENTS

Information processing methods and electronic devices according to the embodiments of the present disclosure achieve the technical effect of improving utilization of a display area of a display unit.

In view of the above technical problem, the general concept of the technical solutions according to the embodiments of the present disclosure is described below.

An information processing method includes: displaying a first identifier indicating time information on a display unit of an electronic device; acquiring first operating state information indicating a first operating state of a first functional unit of the electronic device; determining a first display state of the first identifier based on the first operating state information; and controlling the first identifier to be displayed at the first display state to indicate that the first functional unit is in the first operating state.

As can be seen from the above, a first identifier indicating time information is displayed on the display unit, and a first display state of the first identifier is determined according to first operating state information of a first functional unit. Then the first identifier is displayed to indicate that the first functional unit is in the first operating state through the first display state while indicating the time information. In this way, there is no need to display a specified identifier indicating the operating state on the display unit, improving utilization of the display area of the display unit.

For better understanding, the above technical solutions will be described in detail below in conjunction with accompanying drawings and specific embodiments.

First Embodiment

The first embodiment provides an information processing method applied in an electronic device including a display unit and a first functional unit. In practical applications, the electronic device may be an electronic device with a small display screen such as a smart phone, a smart watch and the like, and will not be enumerated exhaustively in the present embodiment.

Figure 1:
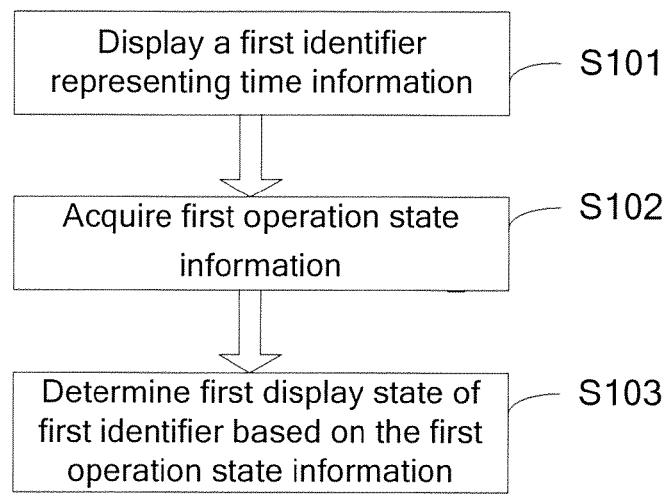
FIG. 1 is a schematic flowchart illustrating an information processing method according to a first embodiment of the present disclosure.

With reference to FIG. 1, illustrated is a schematic flowchart illustrating an information processing method according to the first embodiment of the present disclosure. The method includes:

Step S101: displaying a first identifier indicating time information on the display unit;

Step S102: acquiring first operating state information indicating a first operating state of the first functional unit; and Step S103: determining a first display state of the first identifier based on the first operating state information, and controlling the first identifier to be displayed at the first display state to indicate that the first functional unit is in the first operating state through the first display state.

Specific implementation steps of the information processing method according to the embodiment of the present disclosure will be described in detail below.

Firstly, step S101 of displaying a first identifier indicating time information on the display unit is performed.

In the present embodiment, the time information is indicated by combination of a time scale identifier and a watch hand identifier indicating a current time in the time scale identifier. The first identifier may be the time scale identifier or the hand identifier.

After displaying the first identifier in step S101, step S102 of acquiring first operating state information indicating a first operating state of the first functional unit is performed.

In the embodiment of the present disclosure, the first operating state information may be radio frequency signal strength, remaining capacity, remaining storage space, or data processing progress of the electronic device, and will not be enumerated exhaustively in the present embodiment.

After acquiring the first operating state information in step S102, step S103 is performed to determine a first display state of the first identifier based on the first operating state information, and control the first identifier to be display at the first display state to indicate that the first functional unit is in the first operating state.

In the present embodiment, said determining a first display state of the first identifier based on the first operating state information further includes: searching for the first display state corresponding to the first operating state information according to a preset relation between operating state information and display states based on the first operating state information; and determining that the current display state of the first identifier is the first display state.

In a specific implementation, as the first identifier varies, the preset relation between the operating state information and the display states and thus the method of determining the first display state are changed. Specifically, there may be two cases for the first identifier, i.e., a first case where the first identifier is a time scale identifier and a second case where the first identifier is a watch hand identifier. The present embodiment will be described in detail respectively in these two cases.

First case where the first identifier is a time scale identifier:

In a specific implementation, in the case that the first identifier is a time scale identifier, a display state of the entire time scale identifier may be used to indicate that the first functional unit is in the first operating state. Alternatively, a display state of a part of the time scale identifier may be used to indicate that the first functional unit is in the first operating state.

A. For the case where the display state of the entire time scale identifier is used to indicate that the first functional unit is in the first operating state, FIG. 2 illustrates a first diagram of the first embodiment of the present disclosure in which the first identifier is a time scale identifier.

Figure 2:
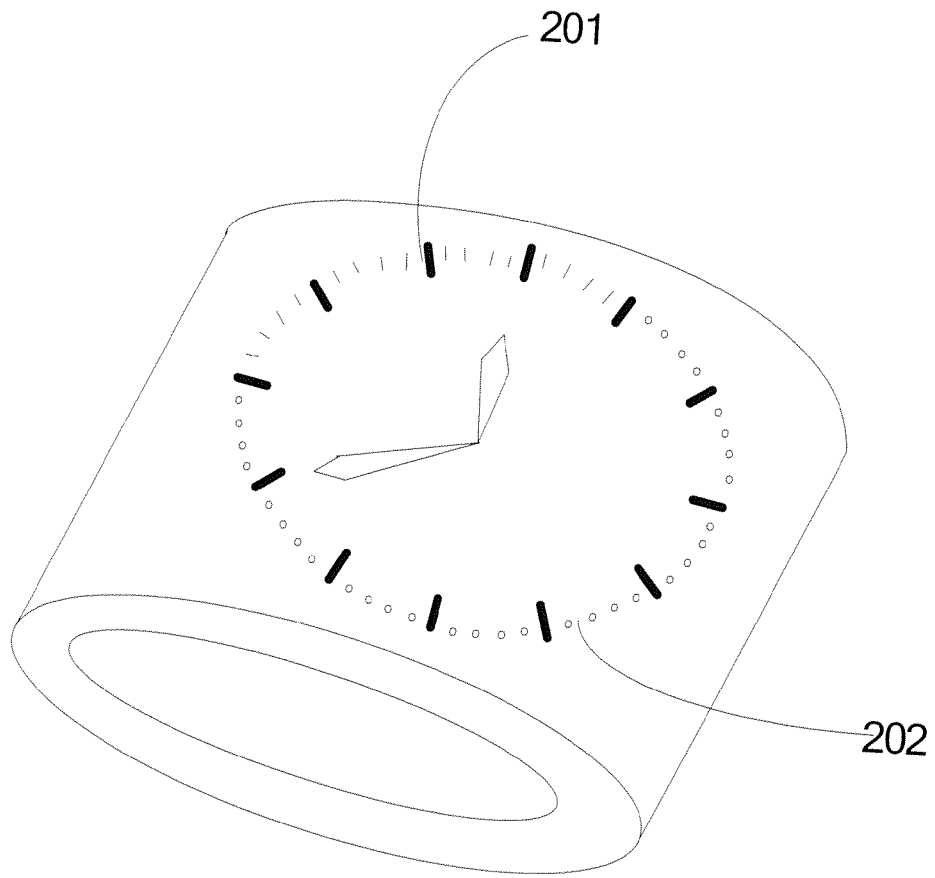
FIG. 2 is a first schematic diagram showing a first identifier as a time scale identifier in the first embodiment of the present disclosure.

As shown in FIG. 2, the entire time scale identifier is divided into two sections for display. Scale lines of the first time scale section 201 are displayed as line segments, and scale lines of the second time scale section 202 are displayed as dots. A ratio between a length of the first time scale section 201 and a length of the entire time scale identifier is used to indicate that the first functional unit is in the first operating state.

For example, a case where the first functional unit is a radio frequency unit, the first operating state is radio frequency signal strength, and the first operating state information is a current radio frequency signal strength level of the first functional unit is taken as an example.

In this case, a preset relation between the operating state information and the display states may be: when the radio frequency signal strength level is strong, the length of the first time scale section 201 is equal to the length of the entire time scale identifier; when the radio frequency signal strength level is medium, the length of the first time scale section 201 is ⅔ of the length of the whole time scale identifier; and when radio frequency signal strength level is weak, the length of the first time scale section 201 is ⅓ of the length of the whole time scale identifier; and when the radio frequency signal strength level is zero, the length of the first time scale section 201 is equal to 0.

It is assumed that the first operating state information that the radio frequency signal strength level is weak is acquired. It can be found out from the above preset relation that the length of the first time scale section 201 corresponding to the weak radio frequency signal strength level is ⅓ of the length of the entire time scale identifier.

Next, as described with reference to FIG. 2, the first display state of the time scale identifier in which scale lines of the first time scale section 201 whose length is ⅓ of the length of the time scale identifier are line segments and scale lines of the remaining scale section are dots is determined, so that a user can intuitively recognize that the current radio frequency signal strength level is weak through a ratio between the length of the first time scale section 201 on the time scale identifier of which the scale lines are line segments and the length of the entire time scale identifier.

Alternatively, the time scale identifier may be set so that the scale lines of the first time scale section 201 are displayed in a first color, and the scale lines of the second time scale section 202 are displayed in a second color different from the first color; or the time scale identifier may be set so that the scale lines of the first time scale length 201 are of a first size and the scale lines of the second time scale length 202 are of a second size different from the first size. Specific setting manners will not be enumerated exhaustively in the present embodiment.

B. For a case where a display state of a part of the time scale identifier is used to indicate that the first functional unit is in the first operating state, FIG. 3 illustrates a second diagram of the first embodiment of the present disclosure in which the first identifier is a time scale identifier.

Figure 3:
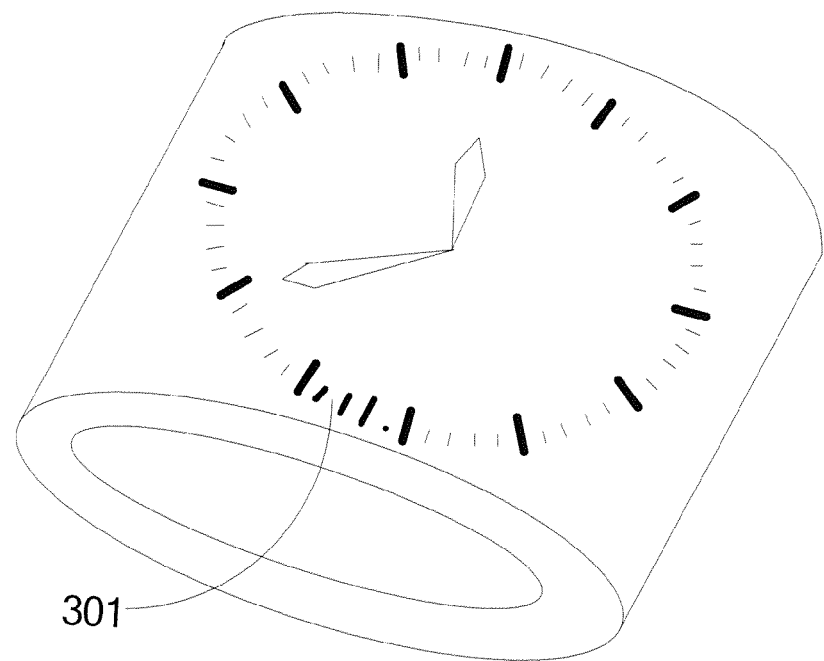
FIG. 3 is a second schematic diagram showing the first identifier as the time scale identifier in the first embodiment of the present disclosure.

As shown in FIG. 3, in the case that the first identifier is a time scale identifier, said determining a first display state of the first identifier further includes: determining a second display state of scale lines in a first scale section 301 and a third display state of remaining scale section in the time scale identifier other than the first scale section, wherein the first scale section 301 is a part of the time scale identifier.

The second display state is used to indicate that the first functional unit is in the first operating state, and the time scale identifier is used to indicate the time information.

In the present embodiment, the second display state comprises at least one color, brightness, size, or shape.

In a specific implementation, as shown in FIG. 3, the first scale section 301 may be set to include four scale lines, and a second display state of the four scale lines is used to indicate that the first functional unit is in the first operating state.

In the case that the first functional unit is a battery unit, the first operating state is battery capacity, and the first operating state information is a percentage of remaining capacity against the total capacity of the battery unit is taken as an example.

In this case, a preset relation between the operating state information and the display states may be that when the remaining capacity is 0%~20% of the total capacity, all the four scale lines of the first scale section 301 are displayed as dots; when the remaining capacity is 21%~40% of the total capacity, among the four scale lines of the first scale section 301, three scale lines are displayed as dots and one scale line is displayed as a line segment; when the remaining capacity is 4%-60% of the total capacity, among the four scale lines of the first scale section 301, two scale lines are displayed as dots and two scale lines are displayed as line segments; when the remaining capacity is 61%~80% of the total capacity, among the four scale lines of the first scale section 301, one scale line is displayed as a dot and three scale lines are displayed as line segments; and when the remaining capacity is 81%~100% of the total capacity, all the four scale lines of the first scale section 301 are displayed as line segments.

Assume the first operating state information which indicates that the remaining capacity is 72% of the total capacity of the battery unit is acquired, it can be found out from the above preset relation that among the four scale lines of the first scale section 301 corresponding to the percentage of 72%, and thus one scale line is displayed as a dot and three scale lines are displayed as line segments.

Next, as shown in FIG. 3, it is determined that among the four scale lines of the first scale section 301, one scale line is displayed as a dot and three scale lines are displayed as line segments, so that a user can intuitively recognize the percentage of the remaining capacity of the battery unit through a number of line segments in the scale lines of the first scale section 301.

In a specific implementation, in order to enable a user to quickly identify the first scale section 301 from the time scale identifier, the scale lines of the first scale section 301 may also be set to be different from scale lines of remaining scale section other than the first scale section 301 in terms of at least one of display color, display shape, display size, or display brightness.

Figure 4:
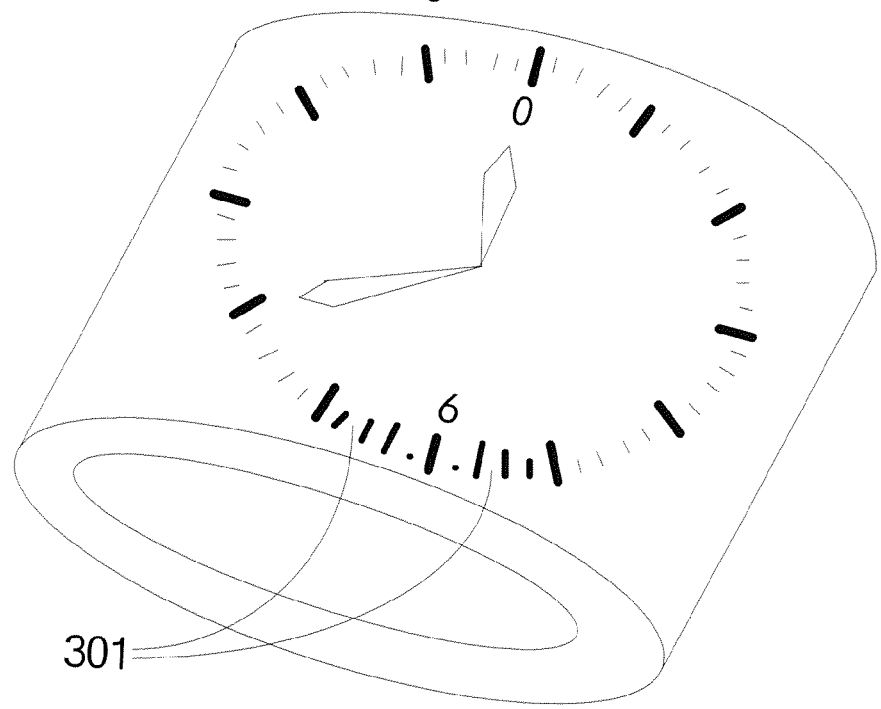
FIG. 4 is a third schematic diagram showing the first identifier as the time scale identifier.

In a specific implementation, in consideration that a user often place a display unit before his/her eyes and acquire time information by taking the 0 o'clock scale on the time scale identifier as a reference when looking at the time information on the display unit, as shown in FIG. 4, the time scale identifier may also be set to include two first scale sections 301, from which distances to the 0 o'clock scale on the time scale identifier are the same, so that the two first scale sections 301 can be displayed on the time scale symmetrically with respect to the 0 o'clock scale when the user views the time information on the display unit.

Second case where the first identifier is a watch hand identifier:

In a specific implementation, when the first identifier is a watch hand identifier, either a display state of the whole hand identifier may be used to indicate that the first functional unit is in a first operating state, or a display state of a part of the hand identifier may be used to indicate that the first functional unit is in the first operating state.

Figure 5:
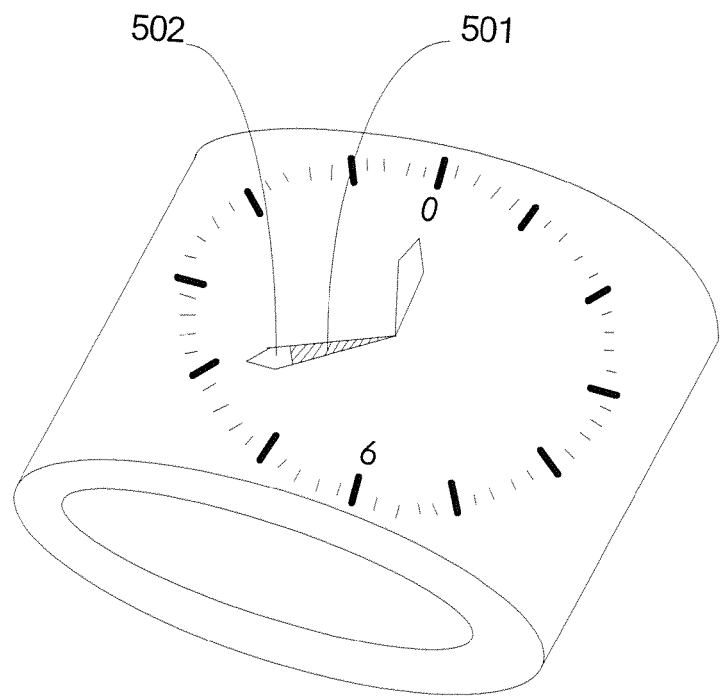
FIG. 5 is a first schematic diagram showing the first identifier as a watch hand identifier in the first embodiment of the present disclosure.

For the case where the display state of the whole hand identifier is used to indicate that the first functional unit is in the first operating state, FIG. 5 illustrates a first diagram of the first embodiment of the present disclosure in which the first identifier is a watch hand identifier.

As shown in FIG. 5, the whole hand identifier is divided into two sections for display. A first hand section 501 is displayed in a first color, and a second hand section 202 502 is displayed in a second color different from the first color. A ratio between a length of the first hand section 501 and a length of the whole hand identifier is used to indicate that the first functional unit is in the first operating state. The specific indication manner is the same as the indication manner in the first case of indicating that the first functional unit is in the first operating state by using a ratio between a length of the first time scale section and a length of the whole time scale identifier. Therefore, the description of the specific indication manner in this case will be omitted here.

Figure 6:
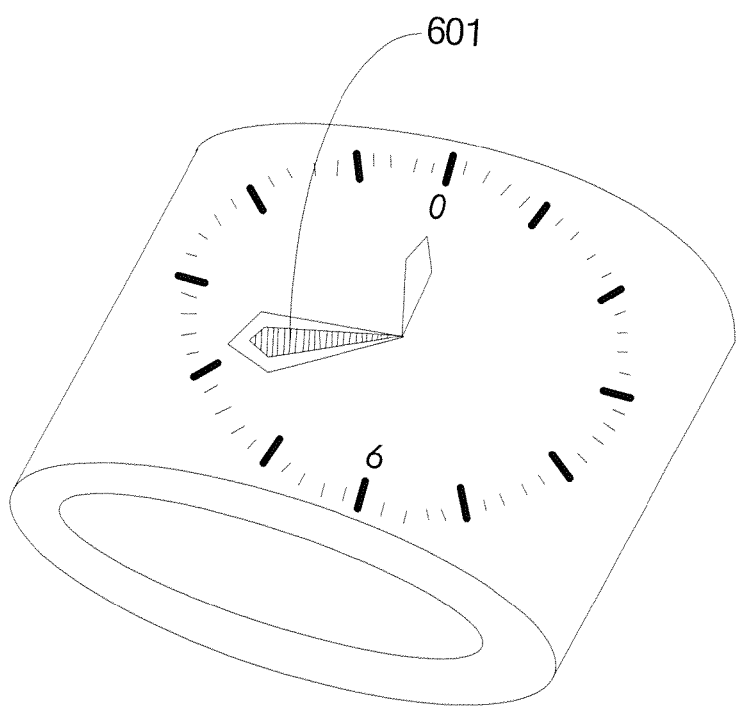
FIG. 6 is a second schematic diagram showing the first identifier as the watch hand identifier in the first embodiment of the present disclosure.

For a case where a display state of a part of the hand identifier is used to indicate that the first functional unit is in the first operating state, FIG. 6 illustrates a second diagram of the first embodiment of the present disclosure in which the first identifier is a watch hand identifier.

As shown in FIG. 6, a color or brightness of a central area 601 of the hand identifier may be used to indicate that the first functional unit is in the first operating state.

For example, a case where the first functional unit is a battery unit, the first operating state is battery capacity, and the first operating state information is a percentage of remaining capacity in the total capacity of the battery unit is taken as an example.

At this time, a preset relation between the operating state information and the display states may be that when the remaining capacity is 0%~25% of the total capacity, the color of the central area 601 is red; when the remaining capacity is 26%~50% of the total capacity, the color of the central area 601 is pink; when the remaining capacity is 51%~75% of the total capacity, the color of the central area 601 is blue; and when the remaining capacity is 76%~100% of the total capacity, the color of the central area 601 is green.

In the present embodiment, as the first operating state changes with time, the display state of the first identifier also changes with time. Thus, after determining the first display state as a current display state of the first identifier in step S103, the following steps are further included:

after the operating state of the first functional unit changes from the first operating state to a second operating state, acquiring second operating state information of the second operating state;

searching for a sixth display state corresponding to the second operating state information according to the preset relation based on the second operating state information; and changing the display state of the first identifier to the sixth display state.

For example, if the first identifier is a time scale identifier, a case where the first functional unit is a battery unit, the first operating state is battery capacity, and the first operating state information is a percentage of remaining capacity in the total capacity of the battery unit is taken as an example.

When the remaining capacity is 72% of the total capacity, as shown in FIG. 3, it is determined that among the four scale lines of the first scale section 301, one scale line is displayed as a dot and three scale lines are displayed as line segments.

When the remaining capacity reduces to 60% of the total capacity after the electronic device operates for a period of time, it can be found out from the preset relation that among the four scale lines of the first scale section 301 corresponding to the percentage of 60% of the remaining capacity against the total capacity, two scale lines are displayed as dots and two scale lines are displayed as line segments.

Figure 7:
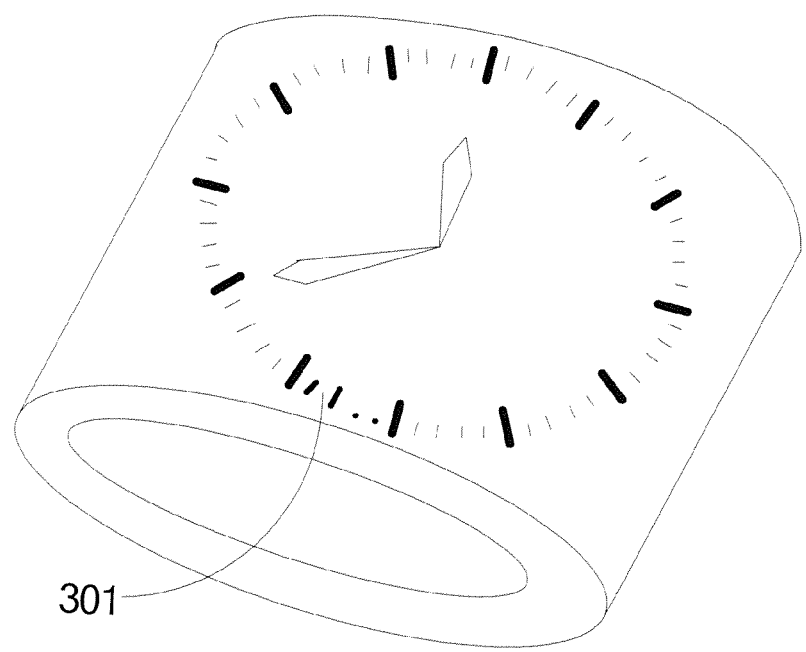
FIG. 7 is a schematic diagram showing before and after a change in a current operating state in the first embodiment of the present disclosure.

Next, as shown in FIG. 7, the display state of the first scale section 301 is changed to a state where among the four scale lines, two scale lines are displayed as dots and two scale lines are displayed as line segments.

On the other hand, the disclosure provides another embodiment based on the same concept, and the specific description thereof can be known with respect to a second embodiment.

Second Embodiment

The second embodiment provides an information processing method applied in an electronic device having a display unit and a first functional unit. In practical applications, the electronic device may be an electronic device with a small display screen such as a smart phone, a smart watch and the like, and will not be enumerated exhaustively in the present embodiment.

As shown in FIG. 1, the method comprises:

Step S101: displaying a first identifier indicating time information on the display unit;

Step S102: acquiring first operating state information indicating a first operating state of the first functional unit; and Step S103: determining a first display state of the first identifier based on the first operating state information, and controlling the first identifier to be displayed at the first display state to indicate that the first functional unit is in the first operating state.

In the present embodiment, the time information is indicated by combination of a character identifier and a delimiter identifier delimiting digit identifier in the character identifier. In this case, the first identifier may be the character identifier.

In the present embodiment, when the first identifier is the character identifier, said determining a first display state of the first identifier further includes: determining a fourth display state of the delimiter identifier in the character identifier and a fifth display state of the digit identifier in the character identifier. The digit identifier is delimited by the delimiter identifier.

The fourth display state is used to indicate that the first functional unit is in the first operating state, and the character identifier is used to indicate the time information.

In the present embodiment, the second display state comprises at least one of color, brightness, size, or shape.

Figure 8:
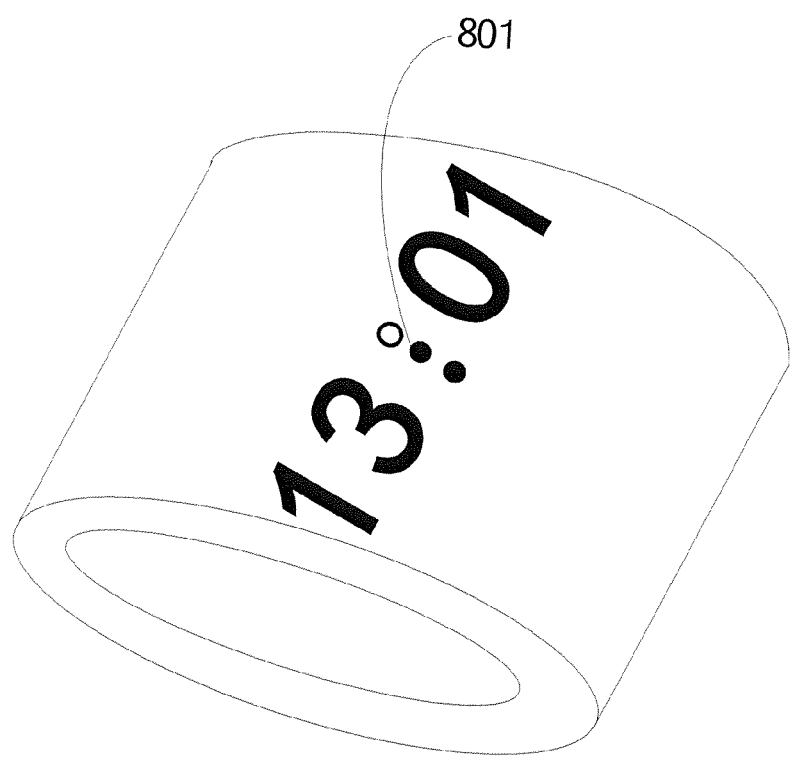
FIG. 8 is a schematic diagram showing a first identifier as a character identifier in a second embodiment of the present disclosure.

With reference to FIG. 8, it illustrates a diagram of the second embodiment of the present disclosure in which the first identifier is a character identifier.

As shown in FIG. 8, the delimiter identifier 801 may be set as three dots; and a fourth display state of the three dots is used to indicate that the first functional unit is in the first operating state.

For example, a case where the first functional unit is a battery unit, the first operating state is battery capacity, and the first operating state information is a percentage of remaining capacity in the total capacity of the battery unit is taken as an example.

As such, a preset relation between the operating state information and the display states may be that when the remaining capacity is 0%~25% of the total capacity, all the three dots of the delimiter identifier 801 are displayed as hollow dots; when the remaining capacity is 26%~50% of the total capacity, among the three dots of the delimiter identifier 801, two dots are displayed as hollow dots and one dot is displayed as a solid dot; when the remaining capacity is 51%~75% of the total capacity, among the three dots of the delimiter identifier 801, one dot is displayed as a hollow dot and two dots are displayed as solid dots; and when the remaining capacity is 76%~100% of the total capacity, all the three dots of the delimiter identifier 801 are displayed as solid dots.

Assumed the first operating state information indicates that the percentage of the remaining capacity is 72% is acquired. It can be found out from the above preset relation that among the three dots of the delimiter identifier 801 corresponding to the percentage of 72%, one dot is displayed as a hollow dot and two dots are displayed as solid dots.

Next, as shown in FIG. 8, it is determined that among the three dots of the delimiter identifier 801, one dot is displayed as a hollow dot and two dots are displayed as solid dots, so that a user can intuitively recognize the percentage of the remaining capacity through a number of solid dots of the delimiter identifier 801.

On the other hand, the disclosure provides an electronic device according to another embodiment of the present disclosure corresponding to the methods according to the first and second embodiments, and the specific description thereof can be known with respect to a third embodiment.

Third Embodiment

The third embodiment provides an electronic device including a first functional unit. In practical applications, the electronic device may be an electronic device with a small display screen such as a smart phone, a smart watch and the like, and will not be enumerated exhaustively in the present embodiment.

Figure 9:
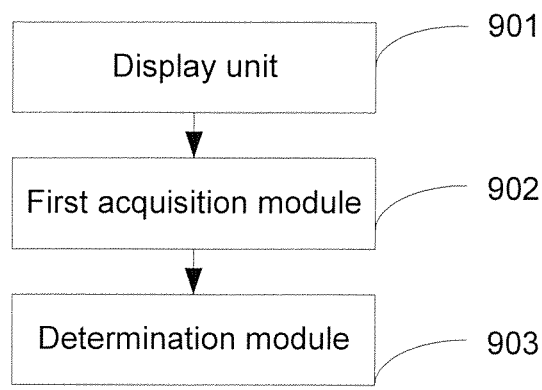
FIG. 9 is block diagram showing an electronic device according to a third embodiment of the present disclosure.

With reference to FIG. 9, illustrated is a block diagram of an electronic device according to the third embodiment of the present disclosure, the electronic device further comprising: a display unit 901 configured to display a first identifier indicating time information; a first acquisition module 902 configured to acquire first operating state information indicating a first operating state of the first functional unit; and a determination module 903 configured to determine a first display state of the first identifier based on the first operating state information, and to control the first identifier to be displayed at the first display state to indicate that the first functional unit is in the first operating state.

The first acquisition module 902 and the determination module 903 may be implemented by a processing unit, such as a processor.

In the present embodiment, in the case that the first identifier is a time scale identifier, the determination module 903 is further configured to: determine a second display state of scale lines in the first scale section and a third display state of remaining scale section in the time scale identifier other than the first scale section. The first scale section is a part of the time scale identifier. The second display state is used to indicate that the first functional unit is in the first operating state, and the time scale identifier is used to indicate the time information.

In the present embodiment, in the case that the first identifier is a character identifier, the determination module 903 is further configured to: determine a fourth display state of a delimiter identifier in the character identifier and a fifth display state of a digit identifier in the character identifier. The digit identifier is delimited by the delimiter identifier. The fourth display state is used to indicate that the first functional unit is in the first operating state, and the character identifier is used to indicate the time information.

In the present embodiment, the second display state comprises at least one of color, brightness, size, or shape.

In the present embodiment, the first operating state information may include radio frequency signal strength, remaining capacity, remaining storage space, or data processing progress of the electronic device.

In the present embodiment, the determination module 903 may include: a search unit configured to search for the first display state corresponding to the first operating state information according to a preset relation between operating state information and display states based on the first operating state information; and a determination unit configured to determine that the current display state of the first identifier is the first display state.

In the present embodiment, the electronic device may further include: a second acquisition module configured to acquire second operating state information of the second operating state in the case the current operating state of the first functional unit is changed from the first operating state to a second operating state; a search module configured to search for a sixth display state corresponding to the second operating state information according to the preset relation based on the second operating state information; and a change module configured to change the display state of the first identifier to the sixth display state.

The electronic device according to the present embodiment and the information processing methods according to the first and second embodiments are two aspects under the same inventive concept. As the implementations of the methods have been described in detail above, those skilled in the art can clearly understand the structure and implementations of the electronic device according to the present embodiment based on the above description. For conciseness of the specification, the description thereof will be omitted here.

The above technical solutions according to the embodiments of the present disclosure provide at least the following technical effects or advantages.

With the methods and electronic devices according to the embodiments of the disclosure, a first identifier indicating time information is displayed on the display unit, and a first display state of the first identifier is determined according to first operating state information of a first functional unit, so that the first identifier can indicate that the first functional unit is in the first operating state through the first display state while indicating the time information. In this way, there is no need to display a specified identifier indicating the operating state on the display unit, improving utilization of the display area of the display unit.

Those skilled in the art should appreciate that the embodiments of the present disclosure can be provided as methods, systems, or computer program products. Therefore, forms such as hardware-only embodiments, software-only embodiments, or embodiments combining software and hardware can be used in the present disclosure. In addition, forms such as a computer program product which is implemented on one or more of computer usable storage media (comprising but not limited to a disk memory, a CD-ROM, an optical memory etc.) with computer usable program codes can be used in the present disclosure.

The present disclosure is described with reference to the flowcharts and/or block diagrams of the methods, devices (systems) and computer program products according to the embodiments of the present disclosure. It should be understood that each flow and/or block in the flowcharts and/or block diagrams as well as a combination of the flows and/or blocks in the flowcharts and/or block diagrams can be implemented by computer program instructions. These computer program instructions can be provided to a processor of a general-purpose computer, a dedicated-purpose computer, an embedded processor, or other programmable data processing devices to generate a machine. Thereby, the instructions executed by the processor of the computer or other programmable data processing devices generate means for implementing functions specified in one or more flows in the flowcharts and/or one or more blocks in the block diagrams.

These computer program instructions can also be stored in a computer readable memory capable of introducing a computer or other programmable data processing devices to operate in a particular mode. Thereby, the instructions stored in the computer readable memory generate an article of manufacture comprising instruction means for implementing functions specified in one or more flows in the flowcharts and/or one or more blocks in the block diagrams.

These computer program instructions can also be loaded onto a computer or other programmable data processing devices, so as to enable a series of operation steps to be performed on the computer or other programmable devices to generate a computer-implemented process. Thereby, the instructions executed on the computer or other programmable devices provide a step of implementing functions specified in one or more flows in the flowcharts and/or one or more blocks in the block diagrams.

Specifically, computer program instructions corresponding to the two information processing methods according to the embodiments of the present disclosure may be stored on a storage medium such as an optical disk, a hard disk, a USB device etc.

For the information processing method according to the first embodiment, when the computer program instructions in the storage medium corresponding to the information processing method are read and executed by an electronic device, the following steps are performed:

displaying a first identifier indicating time information on the display unit;

acquiring first operating state information indicating a first operating state of the first functional unit;

determining a first display state of the first identifier based on the first operating state information; and controlling the first identifier to be displayed at the first display state to indicate that the first functional unit is in the first operating state.

Alternatively, when computer instructions stored in the storage medium, which correspond to the step of determining the first display state of the first identifier in the case that the first identifier is a time scale identifier, are executed, the following steps are further performed:

determining a second display state of scale lines in the first scale section and a third display state of remaining scale section in the time scale identifier other than the first scale section.

The first scale section is a part of the time scale identifier. The second display state is used to indicate that the first functional unit is in the first operating state, and the time scale identifier is used to indicate the time information.

Alternatively, when computer instructions stored in the storage medium, which correspond to the step of determining the first display state of the first identifier in the case that the first identifier is a character identifier, are executed, the following steps are further performed:

determining a fourth display state of a delimiter identifier in the character identifier and a fifth display state of a digit identifier in the character identifier.

The digit identifier is delimited by the delimiter identifier. The fourth display state is used to indicate that the first functional unit is in the first operating state, and the character identifier is used to indicate the time information.

Alternatively, when computer instructions stored in the storage medium, which correspond to the step of determining a first display state of the first identifier based on the first operating state information, are executed, the following steps are further performed:

searching for the first display state corresponding to the first operating state information, according to a preset relation between operating state information and display states based on the first operating state information; and determining that the current display state of the first identifier is the first display state.

Alternatively, the storage medium further stores other computer instructions, which are executed after computer instructions corresponding to the step of determining the first display state as the display state of the first identifier are executed, and the following steps are further performed when these computer instructions are executed:

In the case that the current operating state of the first functional unit is changed from the first operating state to a second operating state, acquiring second operating state information of the second operating state;

searching for a sixth display state corresponding to the second operating state information, according to the preset relation based on the second operating state information; and changing the display state of the first identifier to the sixth display state.

Although preferable embodiments of the present disclosure have been described, changes and modifications can be made to these embodiments by those skilled in the art upon learning the basic creative concepts. Therefore, the appended claims are intended to be construed as comprising the preferable embodiments and all changes and modifications that fall into the scope of the present disclosure.

Obviously, various modifications and variants can be made to the present disclosure by those skilled in the art without departing from the spirit and scope of the present disclosure. Therefore, these modifications and variants are to be encompassed by the present disclosure if they fall within the scope of the present disclosure as defined by the claims and their equivalents.

What is claimed is:

1. An information processing method comprising:
    displaying a first watch hand identifier in a first display state to indicate time information on a display unit of an electronic device;
    acquiring first operating state information indicating a first operating state of a first functional unit of the electronic device;
    determining a second display state of the first watch hand identifier corresponding to the first operating state information and different from the first display state, according to a preset correspondence between operating states of the first functional unit and display states of the first watch hand identifier; and
    changing the first display state of the first watch hand identifier to the second display state to not only indicate the time information but also indicate that the first functional unit is in the first operating state,
    wherein the display state of the first watch hand identifier comprises at least one of color, brightness, size, and shape of the first watch hand identifier.

2. The method according to claim 1, wherein the first operating state information comprises radio frequency signal strength, remaining capacity, remaining storage space, or data processing progress of the electronic device.

3. The method according to claim 1, comprising:
    acquiring second operating state information of a second operating state of the first functional unit, in a case that the operating state of the first functional unit is changed from the first operating state to the second operating state;
    determining a sixth display state of the first watch hand identifier corresponding to the second operating state information according to the preset correspondence; and s
    changing display state of the first watch hand identifier to the sixth display state.

4. An electronic device, comprising:
    a first functional unit;
    a display unit configured to display a first watch hand identifier in a first display state to indicate time information; and
    a processor configured to:
        acquire first operating state information indicating a first operating state of the first functional unit;
        determine a second display state of the first watch hand identifier corresponding to the first operating state information and different from the first display state, according to a preset correspondence between operating states of the first functional unit and display states of the first watch hand identifier; and
        control the display unit to change the first display state of the first watch hand identifier to the second display state to not only indicate the time information but also indicate that the first functional unit is in the first operating state,
    wherein the display state of the first watch hand identifier comprises at least one of color, brightness, size, and shape of the first watch hand identifier.

5. The electronic device according to claim 4, wherein the first operating state information further comprises radio frequency signal strength, remaining capacity, remaining storage space, or data processing progress of the electronic device.

6. The electronic device according to claim 4, wherein the processor is further configured to:
    acquire second operating state information of a second operating state in a case that the operating state of the first functional unit is changed from the first operating state to the second operating state;
    search for a sixth display state corresponding to the second operating state information according to the preset correspondence; and
    change display state of the first watch hand identifier to the sixth display state.

\* \* \* \* \*